US011016126B2

(12) United States Patent
Hurwitz et al.

(10) Patent No.: US 11,016,126 B2
(45) Date of Patent: May 25, 2021

(54) CURRENT MEASUREMENT

(71) Applicant: Analog Devices Global Unlimited Company, Hamilton (BM)

(72) Inventors: Jonathan Ephraim David Hurwitz, Edinburgh (GB); Seyed Amir Ali Danesh, Edinburgh (GB); William Michael James Holland, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 710 days.

(21) Appl. No.: 15/583,257

(22) Filed: May 1, 2017

(65) Prior Publication Data
US 2017/0299636 A1 Oct. 19, 2017

Related U.S. Application Data

(63) Continuation of application No. 14/290,820, filed on May 29, 2014, now Pat. No. 9,638,724.

(30) Foreign Application Priority Data

Jun. 1, 2013 (GB) ..................................... 1309825

(51) Int. Cl.
*G01R 19/00* (2006.01)
*G01R 35/00* (2006.01)
*G01R 17/02* (2006.01)

(52) U.S. Cl.
CPC .......... *G01R 19/0092* (2013.01); *G01R 17/02* (2013.01); *G01R 35/005* (2013.01)

(58) Field of Classification Search
CPC .. G01R 19/0092; G01R 17/02; G01R 35/005; G01R 5/14; G01R 13/00; G01R 27/12; G01R 5/16; G01R 19/22
See application file for complete search history.

(56) References Cited

U.S. PATENT DOCUMENTS 4,933,633 A 6/1990 Allgood
5,386,188 A 1/1995 Minneman et al.
(Continued)

FOREIGN PATENT DOCUMENTS

DE 10310503 A1 9/2004
EP 1637898 A1 3/2006
(Continued)

OTHER PUBLICATIONS

"European Application Serial No. 18172715.7, Extended European Search Report dated May 15, 2019", 16 pgs.
(Continued)

*Primary Examiner* — Jermele M Hollington
*Assistant Examiner* — Suresh K Rajaputra
(74) *Attorney, Agent, or Firm* — Schwegman Lundberg & Woessner, P.A.

(57) ABSTRACT

Current measurement apparatus comprises a measurement arrangement and a signal source. The measurement arrangement is configured to measure a current signal drawn by a load. The signal source is operative to apply a reference input signal to the measurement arrangement whereby an output signal from the measurement arrangement comprises a load output signal corresponding to the load drawn current signal and a reference output signal corresponding to the reference input signal. The signal source comprises a current multiplier which defines first and second current paths and is configured such that: the first path carries a multiplier input current signal; the second path carries a multiplier output current signal which determines the reference input signal and which corresponds to the multiplier input current signal multiplied by a multiplier value determined by the current multiplier; and the multiplier input current signal and the multiplier output current signal are carried on their respective paths in a same direction relative to a power (Continued)

supply voltage. Power drawn through the second path as divided by the multiplier value is less than the power drawn through the first path.

33 Claims, 7 Drawing Sheets

(56) References Cited

U.S. PATENT DOCUMENTS

| | | | |
|---|---|---|---|
| 5,804,979 | A | 9/1998 | Lund et al. |
| 6,011,385 | A | 1/2000 | Brandt et al. |
| 6,522,123 | B2 | 2/2003 | Ribes |
| 7,298,135 | B2 | 11/2007 | Briese et al. |
| 7,613,577 | B2 | 11/2009 | Yamaji et al. |
| 7,741,983 | B1 | 6/2010 | Lakshmikanthan et al. |
| 8,659,286 | B2 | 2/2014 | Reynolds |
| 8,717,051 | B2 | 5/2014 | Sullivan |
| 9,322,850 | B2 * | 4/2016 | Wood .................. G01R 15/14 |
| 9,411,003 | B2 | 8/2016 | Danesh et al. |
| 9,638,724 | B2 | 5/2017 | Hurwitz et al. |
| 2002/0153901 | A1 | 10/2002 | Davis et al. |
| 2004/0061506 | A1 | 4/2004 | Rupp |
| 2004/0145373 | A1 | 7/2004 | Knecht |
| 2006/0167642 | A1 | 7/2006 | Ferrer et al. |
| 2009/0121729 | A1 * | 5/2009 | Farkas ................ G01R 19/0092 324/713 |
| 2009/0267582 | A1 | 10/2009 | Prodic et al. |
| 2010/0225304 | A1 | 9/2010 | Wynne |
| 2013/0113507 | A1 | 5/2013 | Danesh et al. |
| 2014/0354266 | A1 | 12/2014 | Hurwitz et al. |
| 2016/0154029 | A1 | 6/2016 | Danesh et al. |
| 2016/0291060 | A1 | 10/2016 | Wood et al. |

FOREIGN PATENT DOCUMENTS

| | | |
|---|---|---|
| GB | 2224853 A | 5/1990 |
| GB | 2424286 A | 9/2006 |
| WO | WO-2006002446 A1 | 1/2006 |

OTHER PUBLICATIONS

"European Application Serial No. 12769151.7, Communication under Rule 164(2)(a) EPC dated Oct. 2, 2018", 11 pgs.

"U.S. Appl. No. 14/290,820, Notice of Allowance dated Dec. 29, 2016", 10 pgs.

U.S. Appl. No. 14/290,820 U.S. Pat. No. 9,638,724, filed May 29, 2014, Current Measurement.

"European Application Serial No. 12769151.7, Communication pursuant to Article 94(3) EPC dated Jun. 25, 2020", 6 pgs.

* cited by examiner

CURRENT MEASUREMENT

CLAIM OF PRIORITY

This Application is a Continuation of U.S. application Ser. No. 14/290,820, filed on May 29, 2014, which claims priority to United Kingdom Application Serial No. 1309825.6, filed Jun. 1, 2013, the disclosure of which are hereby incorporated by reference in their entirety.

FIELD OF THE INVENTION

The present invention relates to current measurement apparatus and methods of measuring current, in particular but not exclusively for measuring high levels of current present in electricity consumption circuits, electricity generation circuits and the like. The present invention further relates to apparatus, such as electricity storage, generation, transmission, distribution or consumption apparatus, which comprises such current measurement apparatus or is operative to measure current according to such methods.

BACKGROUND ART

A current shunt provides for indirect measurement of current values by measurement of the voltage developed across the current shunt by the current passing through the current shunt. Typical applications for current shunts include electricity usage control, over-current protection and metering of electricity consumption and generation. In use a current shunt of known resistance is provided in series with a load and the voltage developed across the current shunt by the load drawn current is measured. The current passing through the current shunt is then determined on the basis of Ohm's Law in view of the measured voltage and the known resistance of the shunt.

Certain applications, such as metering of electricity consumption and generation, require measurement to high accuracy over extended periods of time. For example in North America the ANSI C12.20 standard specifies an accuracy of ±0.5% for Class 0.5 consumption meters and ±0.2% for Class 0.2 consumption meters. Standards applicable in Europe and elsewhere, such as IEC 62053, specify similar accuracy requirements. It can therefore be appreciated that the resistance of the current shunt must be known to high precision to enable a meter to meet regulated accuracy requirements. Although the shunt resistance is normally low to minimise power dissipation and undesirable circuit effects, the current shunt is nevertheless liable to heating with temperature drift giving rise to a change in resistance which may cause a loss of measurement accuracy in a shunt of ordinary temperature coefficient of resistance. Shunt resistors formed from manganin alloy are therefore widely used in view of their very low temperature coefficient of resistance. It may also be apparent that accurate current measurement depends on measurement of the voltage developed across the shunt being accurate and stable with temperature and lifetime. This is because a change in the transfer gain of the voltage measurement circuit or lack of precision in references used in the voltage measurement circuit will cause an error. It is normal for these reasons to perform a one-off factory calibration when the current shunt and the readout electronics are combined so that a factor related to the actual combined transfer function for current to measurement value, which is determined largely by the shunt resistor and voltage measurement, can be stored and used in subsequent measurements to achieve the desired precision.

An alternative known approach to measuring high values of current involves the use of a current transformer wound on a core, which is disposed around a conductor carrying current to be measured. The current transformer has the advantages over the shunt resistor of being less invasive and providing for isolation from the current carrying conductor. The current transformer is capable of measuring AC current only. The current transformer generates a current in the secondary coil, which is a ratio of the current in the primary conductor, and the secondary coil current is then turned into a voltage by a load, known as a burden resistor. Accurate measurement of the voltage across the burden resistor and accurate knowledge of the transfer function of the primary current to voltage across the burden resistor (i.e. combining the effect of number of turns, the magnetics and the burden resistor) are needed to measure the current accurately and precisely. As with the current shunt, one-off factory calibration is often performed to compensate for inaccuracies in some or all of the elements that contribute to the overall transfer function of primary current to measurement value.

Another approach uses a Hall current probe which is capable of measuring both AC and DC. In an open loop configuration the Hall current probe is, however, liable to non-linearity and temperature drift. In a closed loop configuration the Hall current probe provides an improvement with regards to non-linearity and temperature drift although the weight and size of the configuration increases significantly where higher currents are measured. It is further known to use the Rogowski coil current probe to measure high levels of current. Most known approaches to current measurement, such as by way of the shunt resistor, the current transformer, the Rogowski coil and the Hall current probe, are described and discussed in *Current Sensing Techniques: A Review*, Silvio Ziegler Robert C. Woodward and Herbert Ho-Ching lu, IEEE Sensors Journal, Vol. 9, No. 4, April 2009. The different known approaches have their respective advantages and disadvantages.

Load current measurement is often made in conjunction with line voltage measurement, which involves measuring the voltage between the conductors over which the current is delivered, in order to determine the electrical power. Often a resistive potential divider between the conductors is employed for line voltage measurement. High accuracy power calculation requires accurate and stable relative phase and frequency response of load current and line voltage measurements in order to accurately determine metrics such as the like of power factor, harmonic content and differences between active and reactive power amongst other things.

WO 2013/038176 describes an improved approach to the measurement of current. According to the approach of WO 2013/038176 a current sensor, such as a current shunt, a current transformer, a Hall current probe or a Rogowski coil, is disposed as described above relative to a conductor to sense a load drawn current flowing through the conductor. A reference signal which is known to high precision is applied to the current sensor whereby the current sensor is responsive to both the load drawn current signal and the applied reference signal. The output signal from the current sensor is acquired and the part of the output signal corresponding to the reference signal is extracted from the output signal. Then the transfer function of the current sensor and the current sensor processing chain is determined on the basis of the reference signal and the extracted part of the output signal corresponding to the reference signal. Thereafter the actual load drawn current flowing through the conductor is determined in dependence on the transfer function and the load drawn current as sensed by the current sensor. Accuracy of measurement of the load drawn current therefore depends on the reference signal being known to high precision instead of the current sensor and its processing chain being known to high precision as according to the previously described approaches. The lack of reliance on the known precision of the current sensor means a lower quality sensor may be used. There is also less need for initial calibration and periodic subsequent recalibration of the current sensor and its processing chain. Furthermore the approach of WO 2013/038176 addresses drift of the current sensor and its processing chain arising from the like of ageing and temperature change and also provides for additional functionality, such as the detection of tampering with electricity consumption meters.

The approach of WO 2013/038176 relies on the precision and stability of the reference signal. WO 2013/038176 describes a current reference circuit which is operative to set the reference signal applied to a current sensor by a signal source. The current reference circuit comprises a voltage controlled current source comprising a current mirror which is driven by a bias voltage provided by an amplifier which is in turn driven by an output from a silicon bandgap reference. WO 2013/038176 further describes different approaches to calibration of the current reference circuit.

Normally the reference signal of the apparatus of WO 2013/038176 is of much smaller amplitude than the load drawn current signal. Even so, the present inventors have appreciated that increasing the amplitude of the reference signal increases the signal to noise ratio and thereby provides for accuracy of current measurement. On the other hand, an increase in the amplitude of the reference signal increases the power consumption of the current measurement apparatus. Although the power supply for the current reference circuit of WO 2013/038176 is typically AC, power consumption is nevertheless limited by cost and size considerations. The present inventors have therefore recognised the desirability of obtaining a reference signal of as large amplitude as can be afforded by a limited power budget. The present inventors have also recognised that the current reference circuit should have a high output impedance to absorb voltage and impedance changes arising from changes in the load drawn current signal.

The present invention has been devised in the light of the above described problems. It is therefore an object for the present invention to provide current measurement apparatus which is configured to increase an amplitude of the reference signal in a power efficient fashion for accurate measurement of current, for example, in a circuit carrying mains current. It is another object for the present invention to provide a method of increasing an amplitude of the reference signal in a power efficient fashion to provide for accurate measurement of current, for example, in a circuit carrying mains current.

STATEMENT OF INVENTION

According to a first aspect of the present invention there is provided current measurement apparatus comprising:
 a measurement arrangement configured to be disposed in relation to a load which draws a current signal, the measurement arrangement being operative when so disposed to measure the load drawn current signal;
 a signal source operative to apply a reference input signal to the measurement arrangement whereby an output signal from the measurement arrangement comprises a load output signal corresponding to the load drawn current signal and a reference output signal corresponding to the reference input signal; and
 processing apparatus which is operative to receive the output signal and to make a determination in dependence on the reference output signal, in which
 the signal source comprises a current multiplier which defines first and second current paths, the current multiplier being configured such that: the first path carries a multiplier input current signal; the second path carries a multiplier output current signal which determines the reference input signal and which corresponds to the multiplier input current signal multiplied by a multiplier value determined by the current multiplier; and the multiplier input current signal and the multiplier output current signal are carried on their respective paths in a same direction relative to a power supply voltage, and
 the signal source is configured such that power drawn through the second path as divided by the multiplier value is less than the power drawn through the first path.

In use the measurement arrangement is disposed relative to a load which draws a current signal. For example a current sensor comprised in the measurement arrangement, such as a current shunt or a current transformer, is disposed relative to a conductor such that the current sensor senses the load drawn current. The signal source applies a reference input signal to the measurement arrangement. The measurement arrangement is operative to provide an output signal comprising a load output signal corresponding to the load drawn current signal and a reference output signal corresponding to the reference input signal. The processing apparatus receives the output signal and makes a determination in dependence on the reference output signal and the load output signal. For example the processing apparatus may be operative to extract the reference output signal from the output signal, such as by way of frequency analysis of the output signal, and to determine a transfer function for the measurement arrangement in dependence on the extracted reference output signal and the reference input signal. As is described further below the advance according to the present invention is embodied to an appreciable extent in the signal source.

In devising the present invention the inventors bore in mind the conflicting requirements for a precise and stable voltage reference, a precise and stable voltage to current converter, a precise and stable current modulator and for as appreciable amplitude of reference input signal as may be afforded by a limited power budget and realised these conflicting requirements may be addressed by configuring the signal source. The inventors also appreciated that the impedance of the measurement arrangement and the voltage dropped across the measurement arrangement is normally very low. The inventors realised that these characteristics of the measurement arrangement afforded a basis for a new form of signal source which addresses the above mentioned conflicting requirements. Considering the signal source further, the signal source according to the invention comprises a current multiplier which defines first and second paths. In use the first path carries a multiplier input current signal, such as is provided by way of a voltage controlled current source, and the second path carries a multiplier output current signal which determines the reference input signal applied to the measurement arrangement. The current multiplier is configured such that the multiplier output current signal corresponds to the multiplier input current signal as multiplied by a multiplier value which is determined by the current multiplier. The current multiplier may be configured to increase a current level in the second path relative to the first path by an order of magnitude to over three orders of magnitude. The signal source may thus allow for precision to be determined in respect of a signal of smaller amplitude before the smaller amplitude signal is multiplied to greater amplitude prior to application to the measurement arrangement. The present invention may provide a means to achieve high precision and perhaps precision better than 0.1%. In addition the current multiplier is configured such that the multiplier input current signal and the multiplier output current signal are carried on their respective paths in a same direction relative to a power supply voltage, such as a positive power supply voltage. Such a configuration may provide for a reduction in supply power overhead in respect of the second path compared, for example, with configurations in which the multiplier input current signal and the multiplier output current signal are carried in opposite directions relative to a power supply voltage. The signal source is configured such that power drawn through the second path as divided by the multiplier value is less than the power drawn through the first path. As a consequence a current signal is multiplied by a multiplier value to a desired level for subsequent application to the measurement arrangement but without a corresponding increase in power consumption. It has been found that a 20% to 85% improvement in efficiency of operation with regards to power consumption can be achieved for a multiplier value of more than ten depending on the specific configuration of the signal source.

The signal source may be configured such that the reference input signal is determined by the multiplier output current signal and the multiplier input current signal. More specifically the signal source may be configured such that the multiple output current signal and the multiplier input current signal are combined with each other. The current multiplier may be configured such that the first and second paths combine whereby the multiplier output current signal and the multiplier input current signal are added to each other. Combining the multiplier output current signal and the multiplier input current signal may provide for a further improvement in efficiency of operation with regards to power consumption. Combining the multiplier output current signal and the multiplier input current signal may provide for improved independence of the multiplier value from the load drawn signal. The reference input signal may correspond to the combination of the multiplier output current signal and the multiplier input current signal. In certain forms of the invention the signal source may comprise a multiplexer which receives an output from the current multiplier. The current measurement apparatus may be configured to measure current in each of plural conductors of a multi-phase electricity supply. More specifically the current measurement apparatus may be configured such that the multiplexer is operative to apply a reference input signal to each of plural current measurement arrangements at different times. For example the multiplexer may be operative to apply a reference input signal to a shunt resistor on a live conductor at one time and a current transformer on a neutral conductor at another time. Such forms of the invention may be comprised in current measuring apparatus according to the second aspect of the present invention which is described below.

The current multiplier may be configured such that the multiplier value is determined by a ratio of resistors. Determining the multiplier value by way of a resistor ratio may be advantageous where the current multiplier is comprised in an integrated circuit. At least one of the resistors which provides for the ratio of resistors may comprise plural resistor elements. The ratio of resistors may be constituted by the plural resistor elements to thereby provide for ease of matching of the ratio of resistors. Precision of matching of the resistor ratio may be important to achieve overall precision and high accuracy of current measurement by way of the current measurement apparatus. An overall precision of better than 0.1% may be desired for certain applications. The plural resistor elements may be provided in at least one of series and parallel arrangements. The plural resistor elements may be disposed relative to each other, for example, to address integrated circuit processing spreads or temperature drift. At least one of the resistors which provides for the ratio of resistors may be variable to thereby provide for change in the multiplier value. More specifically a variable resistor may comprise plural resistor elements. The current multiplier may comprise at least one switch. The at least one switch may be operative to change a configuration of the plural resistor elements to thereby vary resistance. The current multiplier may comprise redundant resistor elements to address degradation over time of the resistor ratio. More specifically the current multiplier may be configured, such as by way of switches, to change between an operative resistor element and a previously redundant resistor element to, for example, reduce the effects of resistor element degradation with lifetime. Usage duty cycles of two such resistor elements employed as an operative resistor element may be different to provide for tracking or detection of degradation. Where the current multiplier comprises plural switchable resistors, the current measurement apparatus may be operative to switch the resistors comprised in the ratio of resistors to modulate a signal received by the current multiplier, such as from a voltage controlled current source. Such modulation may be employed to provide a reference input signal of desired time or frequency domain characteristics and obviate the need for modulation either before or after the current multiplier.

The ratio of resistors may comprise a first resistor comprised in the first path and a second resistor comprised in the second path, with the relative values of the first and second resistors being set to provide a desired multiplier value. The first and second resistors may be electrically connected to an output of the current multiplier, the output of the current multiplier carrying a current signal which determines the reference input signal. More specifically and where the current multiplier receives power from a positive supply, the first and second resistors may be disposed on a low voltage end of the current multiplier, i.e. distal a high voltage supply to the current multiplier. The current multiplier may be configured to swap elements of the first and second resistors on a periodic basis. The current multiplier may comprise at least one switch which is operative to swap elements of the first and second resistors. Swapping of the resistors may address resistance mismatching to first order by averaging such mismatch over time. The resistor ratio constituted by the first and second resistors may be configured to provide for maintenance of a multiplier value after a swap. More specifically each of the first and second resistors may comprise plural resistor elements which are switched to provide for a change in resistance value. Swapping may introduce ripple in current signals flowing in the current multiplier. The current multiplier may therefore be operative to swap the first and second resistors at a frequency related to a frequency of the reference input signal.

The current multiplier may be configured to receive a source of current which flows in the first path and may comprise a current source in the second path. The source of current may therefore flow through the first resistor and the current source may therefore be in series with the second resistor. Such a configuration may provide for independence from the load drawn current passing through the measurement arrangement. The current multiplier may be configured such that the second resistor is on a same side of the current source as the measurement arrangement. The source of current may be received at a first end of the first resistor further from the measurement arrangement the second opposite end of the first resistor. The current multiplier may be configured such that the current source is on an opposite side of the second resistor to the measurement arrangement. Thus a current multiplier output from which the reference input signal is derived and through which the multiplier output current signal flows may be connected to a second end of the second resistor and a first opposite end of the second resistor may be connected to the current source. The first end of the first resistor may receive an input to the current multiplier. A second opposite end of the first resistor may be connected to the current multiplier output. The input to the current multiplier may therefore be the multiplier input current signal. Such a configuration of current multiplier may allow for the multiplier input current signal and the multiplier output current signal to flow in the same direction relative to the positive power supply voltage.

The current multiplier may comprise a comparison arrangement which is configured to compare a first voltage at the first end of the first resistor with a second voltage between the current source and the second resistor and provide a comparison output in dependence on the comparison. The comparison arrangement may be at least one of auto-zeroed and chopped to thereby minimise offset and low frequency noise. The current source may be a controllable current source which is operative to vary its output current in dependence on the comparison output. The current multiplier may thus be configured to maintain the first and second voltages at substantially the same value whereby the multiplier value is determined by the ratio of the first and second resistors. The comparison arrangement may comprise an operational amplifier. The operational amplifier may be comprised in an analogue loop. Alternatively the comparison arrangement may comprise a comparator. The comparator may be comprised in a digital loop. At least one of the current source and the comparison arrangement may be switched to thereby provide for modulation of a form described above with reference to the switched resistor ratio.

In a first form, the current source may comprise an active circuit and more specifically a transistor such as a FET. A gate or base of a transistor may constitute a control input of the current source. The voltage headroom in the second path may be determined by the voltage across each of the current source and the second resistor and the voltage level required to accommodate the swing in the output voltage from the current multiplier. Such voltage headroom is often smaller than the voltage headroom determined by circuitry operative to provide the source of current to the first resistor and by the first resistor. An improvement in power supply efficiency may therefore be achieved if the current source obtains power from a power supply of lesser voltage magnitude than a power supply to circuitry operative to provide the source of current to the first resistor. The power supply for the current source may be of the order of 100 mV, 200 mV, 400 mV or 800 mV with such a figure being much less than the power supply voltage required to provide the source of current to the first resistor. The current multiplier may therefore comprise a DC-DC converter which is operative to reduce a magnitude of a power supply voltage to the current source from a power supply voltage applied elsewhere. The DC-DC converter may be of a switched capacitor type or a switched inductor type and may generate a controlled voltage with some appreciable ripple. The ripple may need to be taken into account with regards to the voltage headroom. The current measurement apparatus may be configured such that the DC-DC converter is operative with plural current multipliers. There may, for example, be plural current sensors in a multi-phase arrangement and a single DC-DC converter may provide power to each of plural current multipliers which apply a reference input signal to a respective one of the plural current sensors. The current measurement apparatus may be configured such that the DC-DC converter has multiple outputs and is shared in time amongst plural current multipliers or with other applications where there are periods when less power taken by a current multiplier because of modulation of the reference input signal.

The present inventors have appreciated that a DC-DC converter is often inefficient of itself. Also the presence of a DC-DC converter may increase the pin count. The present inventors have been further appreciative of the loss in voltage headroom across the current source and also the need to accommodate the ripple of the DC-DC converter and the swing in the output voltage from the current multiplier. The present inventors have devised a second form of current multiplier which addresses these problems. The current source comprised in the second form of current multiplier may comprise an inductor in series with the second resistor. An end of the inductor opposite an end of the inductor which is connected to the second resistor may be switched between a high side of a power supply and a low side of the power supply. The high side of the power supply may be at a same voltage as a power supply to, for example, circuitry operative to provide the source of current to the first resistor. The switching of the inductor may be in dependence on the comparator output. More specifically the switching of the inductor may be controlled by an output from a pulse width modulator which is controlled by the comparator output. The second form of current multiplier may be operative to maintain the first and second voltages substantially the same. More specifically the second form of current multiplier may be operative to maintain an average of the second voltage substantially the same as the first voltage. The second form of current multiplier may provide a more power efficient approach than the first form of current multiplier, may remove the need for the DC-DC converter and may avoid the voltage drop across the active circuit comprised in the current source of the first form of current multiplier. The current measurement apparatus may be configured for sharing of the inductor in time with another current multiplier. The current measurement apparatus may therefore comprise a multiplexer which is operative to provide for such sharing. The current measurement apparatus may be configured to interleave operation of the inductor between at least two signal sources instead of relying on the aforementioned multiplexer at the output of a single current multiplier. The second form of current multiplier may comprise a switched transformer instead of a switched inductor.

The second form of current multiplier may further comprise a low pass filter which is disposed within the current multiplier to maintain an average of the second voltage substantially the same as the first voltage. More specifically the low pass filter may be operative to average a change in the multiplier current caused by the switching of the inductor when the inductor is switched at a higher frequency than a bandwidth of the low pass filter. The low pass filter may be comprised in the feedback loop comprising the comparison arrangement and the current source. The low pass filter may be connected between the inductor end of the second resistor and an input, such as an inverting input, to the comparison arrangement. Alternatively or in addition the low pass filter may be comprised in the comparison arrangement, the comparison arrangement being configured as an integrator. Alternatively or in addition the low pass filter may be comprised in the comparison arrangement, with the comparison arrangement being configured to such that its bandwidth is limited to provide for filtering. Alternatively or in addition the low pass filter may comprise a capacitor attached across the second resistor.

The current multiplier may be configured such that a bias current flows through the first path. The bias current may be considered as a pedestal current. The presence of a bias current may provide for proper operation of the like of the current source and the comparison arrangement when the multiplier input current signal is at a low level.

An amplitude of the reference input signal may be much smaller than an amplitude of the load drawn current. The load drawn current signal may be at least 0.1 Amp peak or RMS. More specifically the load drawn current signal may be at least 1 Amp peak or RMS, 5 Amps peak or RMS, 10 Amps peak or RMS, 20 Amps peak or RMS, 40 Amps peak or RMS, 80 Amps peak or RMS, 100 Amps peak or RMS, 200 Amps peak or RMS or 320 Amps peak or RMS. In contrast the reference input signal may be between 100 µA and 500 mA.

The determination made by the processing apparatus may be made in dependence on the load output signal in addition to the reference output signal. More specifically the determination made by the processing apparatus may be in respect of at least one of the load drawn current signal and electrical power consumed by the load. Alternatively or in addition the processing apparatus may be operative to determine at least one of a transfer function and a change in a transfer function of the measurement apparatus. There may be no need to make a determination in dependence on the load output signal when the transfer function or a change in the transfer function is determined. The processing apparatus may be operative to determine one or more conditions in dependence on the transfer function or change in transfer function, such as a fault condition or to detect tampering of an electricity consumption meter where the current measurement apparatus forms part of such an electricity consumption meter. The transfer function or change in transfer function may be determined on a periodic basis.

The current measurement apparatus may comprise a voltage reference, such as a bandgap reference, with the current measurement apparatus being configured such that the multiplier input current signal is dependent on an output from the voltage reference.

The current measurement apparatus may comprise a voltage to current converter, such as a voltage controlled current source, with the current measurement apparatus being configured such that the multiplier input current signal is dependent on an output from the voltage to current converter. An output from the voltage to current converter may be determined by an output from a voltage reference.

The current measurement apparatus may comprise a modulator which is operative to provide a reference input signal of predetermined form. As described above the modulator may be comprised in the current multiplier, such as in the form of a switched resistor ratio. Alternatively or in addition the modulator may be operative on an output from a voltage to current converter to provide a modulated input signal to the current multiplier. The modulator may comprise a current mode digital to analog converter.

In one form, the signal source may receive electrical power from a power supply of higher voltage than an output from the signal source which provides the reference input signal. In this form the signal source may be operative to source the reference input signal. In another form, the signal source may receive electrical power from a power supply of lower voltage than an output from the signal source which provides the reference input signal. In this form the signal source may be operative to sink the reference input signal. The signal source may therefore be operated from either a positive power supply or a negative power supply relative to the measurement arrangement.

The measurement arrangement may comprise a current sensor which is operative to measure the load drawn current in a conductor. The current sensor may be a shunt resistor, a current transformer, a Hall current probe or a Rogowski coil current probe.

Where the load drawn current signal is an alternating current, the fundamental frequency of the alternating current may be less than 500 Hz, such as a frequency of substantially 60 Hz or substantially 50 Hz for domestic mains or a frequency of substantially 400 Hz for mains in ships or aircraft. Alternatively or in addition a frequency of the reference input signal may be less than 250 kHz, 100 kHz, 50 kHz, 20 kHz, 10 kHz, 5 kHz, 2.5 kHz or 1.25 kHz, 625 Hz, 320 Hz, 160 Hz, 80 Hz or less than the fundamental of the load drawn current.

Where a load draws current from a multi-phase mains electricity supply, according to a second aspect of the present invention there may be provided current measuring apparatus comprising at least one current measurement apparatus according to the first aspect of the present invention, the at least one current measurement apparatus being configured to measure current in each of plural conductors of the electrical supply. For example the multi-phase mains electricity supply may be a split-phase supply, a three phase supply or even a supply with more than three phases. The at least one current measurement apparatus may comprise plural measurement arrangements configured to be disposed relative to different conductors of the electricity supply. In addition the at least one current measurement apparatus may comprise a signal source and processing apparatus which are multiplexed between different conductors. Alternatively the at least one current measurement apparatus may comprise plural signal sources and processing apparatus which are each operative to apply reference input signals and to process measurement arrangement output signals in respect of different conductors. Further embodiments of the second aspect of the invention may comprise one or more features of the first aspect of the invention.

According to a third aspect of the present invention there is provided a current measurement method by way of current measurement apparatus which is operative to carry out steps according to the first aspect of the present invention. Embodiments of the second aspect of the present invention may comprise one or more features of the first aspect of the present invention.

According to a fourth aspect of the present invention there is provided electrical apparatus comprising current measurement apparatus according to the first aspect of the present invention or current measuring apparatus according to the second aspect of the present invention, the electrical apparatus being configured such that the current measurement apparatus or current measuring apparatus measures current passing through a part of the electrical apparatus. The present invention according to the first, second or fourth aspect may be configured to be operative with an arrangement in which a load draws an AC or DC current signal. The electrical apparatus may comprise DC apparatus, such as an electric battery and a battery charger, and the current measurement apparatus may be configured to measure at least one of a current sourced by the DC apparatus and a current sunk by the DC apparatus. The electrical apparatus may comprise AC apparatus and the current measurement apparatus may be configured to measure at least one of a current sourced by the AC apparatus and a current sunk by the AC apparatus. The present invention according to the first, second or fourth aspect may be configured to be operative with an arrangement supplied by an AC source, such as a mains electricity supply, an inverter or the like, or supplied by a DC source such as an AC/DC power supply, an electric battery, a dynamo or the like.

Alternatively or in addition the electrical apparatus may comprise electricity storage, generation, transmission or distribution apparatus. Where the electrical apparatus comprises electricity storage apparatus the electrical apparatus may comprise an electric battery. The electrical apparatus may, for example, be constituted by an electricity meter or a distribution box with the current measurement apparatus being operative to measure current passing through the electricity meter or distribution box. The current measurement apparatus may thereby provide a means to measure the electricity consumed by a residence, business or electrically powered device or generated by generation apparatus, such as a solar panel based generator. Alternatively or in addition the electrical apparatus may comprise electrical propulsion apparatus comprising an electrical energy storage or generation device, such as a battery or fuel cell. The electrical propulsion apparatus may be configured such that the current measurement apparatus is operative to provide for regulation, e.g. by measurement of direct current, of at least one of: power sourced by the electrical energy storage or generation device; and power sunk by the electrical energy storage device, e.g. during charging. Safe and reliable delivery of electrical power to electric motors at high current levels is normally required of such electrical propulsion apparatus. Accurate current measurement may therefore be required to provide for proper regulation and control and to monitor for fault conditions. Alternatively or in addition the electrical apparatus may comprise electrical control apparatus comprising an electrical actuator. The electrical control apparatus may be configured such that the current measurement apparatus is operative to measure current drawn by the electrical actuator. The electrical actuator may comprise a motor and the current metrology apparatus may be comprised in a motor controller which is operative to control the motor. Electrical control apparatus may be used in diverse fields, such as manufacturing, commercial machinery and process control. For example the electrical actuator may comprise a stepper motor forming part of a CNC machine or driving a valve in a fluid control system. Alternatively the electrical actuator may comprise a linear solenoid in an electrically controlled automotive transmission system. In such applications accurate measurement of current may provide for precision of control. Further embodiments of the fourth aspect of the present invention may comprise one or more features of any previous aspect of the present invention.

BRIEF DESCRIPTION OF DRAWINGS

Further features and advantages of the present invention will become apparent from the following specific description, which is given by way of example only and with reference to the accompanying drawings, in which.

DESCRIPTION OF EMBODIMENTS

Figure 1:
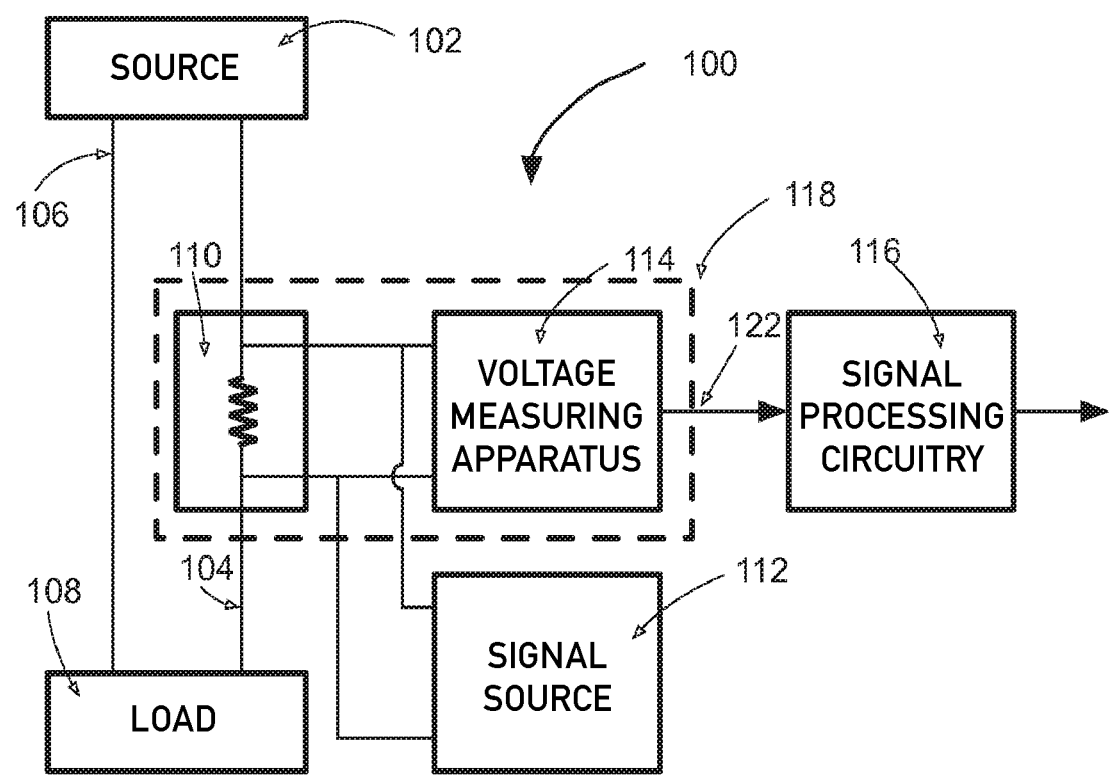
FIG. 1 is a block diagram representation of current measurement apparatus embodying the present invention.

Current measurement apparatus 100 which embodies the present invention is shown in FIG. 1. The current measurement apparatus 100 forms part of an electricity consumption meter (not shown) installed at a point of supply to residential or business premises. A single phase mains alternating current electricity source 102 with live 104 and neutral 106 supply wires are shown in FIG. 1. Energy consuming apparatus at the residential or business premises is represented by a load 108. The current measurement apparatus 100 comprises a shunt resistor 110 (which constitutes a current sensor) in the live supply wire 104 in series with the load 108 between the load and the electricity supply 102. The shunt resistor 110 presents a low value of resistance, such as a resistance of 200 uΩ. The shunt resistor 110 is formed from a length of electrical wire, a length of conductive track on a printed circuit board, a discrete component, a conductor comprised in an integrated circuit package such as a lead frame or a structure formed as part of a connector or conductive element of a series component such as a relay. As will become apparent from the following description the shunt resistor need not be formed to provide an accurate or stable resistance; nor need the processing chain for the shunt resistor be accurately characterised. The current measurement apparatus 100 further comprises a signal source 112, voltage measuring apparatus 114 and signal processing circuitry 116. The shunt resistor 110 and the voltage measuring apparatus 114 constitute a measurement arrangement 118 and the signal processing circuitry 116 constitutes processing apparatus. Although not shown in FIG. 1 the current measurement apparatus comprises a noise filter at the input of the voltage measuring apparatus 114 to suppress undesirable noise signals, such as impulse signals, which might otherwise be liable to disrupt operation of the current measurement apparatus. Each of the voltage measuring apparatus 114 and the signal source 112 is electrically connected to opposing ends of the shunt resistor 110. In one form the current measurement apparatus 100 is constituted such that the signal source 112 is always present with the rest of the current measurement apparatus 100 such that the signal source and the rest of the current measurement apparatus 100 is permanently in situ. In another form the current measurement apparatus 100 is constituted such that the signal source is comprised in a separate unit from the rest of the current measurement apparatus 100, which is permanently in situ. When it is desired to provide for accurate measurement, e.g. as part of a periodic calibration procedure, the unit comprising the signal source 112 is brought into use, for example by a calibration engineer, and connected across the shunt resistor 110 before calibration begins. Approaches to calibration applicable to the current measurement apparatus of FIG. 1 are described in WO 2013/038176.

Operation of the current measurement apparatus 100 of FIG. 1 will now be described. As a current signal is drawn by the load 108 through the shunt resistor 110 the signal source 112 is operative on an intermittent basis to apply a reference input signal to the shunt resistor 110 such that a reference current signal passes through the shunt resistor 110. The reference input signal has a known frequency or phase profile, which is substantially absent from the load drawn current signal. For example the reference input signal may consist of at least one component of frequency higher than the mains frequency, such as components of a frequency greater than 5 kHz where the mains has a dominant frequency component of 50 Hz such that the reference signal frequency components lie outside a band of the mains frequency. Alternatively the reference input signal may be at a frequency lower than the mains dominant frequency. The voltage measuring apparatus 114 is operative to acquire by way of a programmable gain amplifier and analogue to digital conversion circuitry a voltage signal developed across the shunt resistor 110 by the load drawn current and reference input signals and to generate a corresponding acquired voltage signal 122. The acquired voltage signal 122 comprises a reference output signal corresponding to the reference input signal and a load output signal corresponding to the load drawn current signal. The signal processing circuitry 116 is operative to extract the reference output signal from the acquired voltage signal 122. Extraction is achieved by applying a frequency transformation, such as in accordance with a Fast Fourier Transform (FFT) algorithm, to the acquired voltage signal 122 or by filtering the acquired voltage signal 122 on the basis of the different frequency profiles of the reference output signal and the load output signal. Then the signal processing circuitry 116 is operative to determine a transfer function, e.g. complex impedance, for the shunt resistor 110 and the voltage measuring apparatus 114 in dependence on the reference input signal and the extracted reference output signal. The current measurement apparatus 100 stores the determined transfer function. Thereafter the signal processing circuitry 116 is operative to determine the load drawn current signal in dependence on the stored transfer function and the load output signal. More specifically the reference output signal is subtracted from the acquired voltage signal 122 to determine the load output signal.

The signal source 112 is operative to apply the reference input signal to the shunt resistor 110 on an intermittent basis to maintain a desired accuracy of measurement. Between applications of the reference input signal the voltage measuring apparatus 114 is operative to determine the load drawn current signal in dependence on the transfer function or factor and the acquired voltage signal 122, which corresponds to the load drawn current signal in view of the lack of application of the reference input signal to the shunt resistor 110. The transfer function and thereafter the load drawn current signal are determined to a desired accuracy by relying on the reference input signal. The present invention is operative to characterise the measurement arrangement (i.e. the shunt resistor 110 and the voltage measuring apparatus 114 as indicated by the dashed box around these components in FIG. 1) by way of the transfer function. Having determined the load drawn current signal the current measurement apparatus 100 is operative to multiply the instantaneous supply current and line voltage to determine the instantaneous power consumption, which is then integrated against time to provide the energy used. Different approaches to relying on the reference input signal to provide for measurement to a desired accuracy are described in WO 2013/038176. WO 2013/038176 also describes various applications of the current measurement apparatus which make use of the transfer function or a change in the transfer function, such as tamper and fault condition detection, along with use of the current measurement apparatus in both AC and DC equipment and in multi-phase electrical arrangements.

Figure 2:
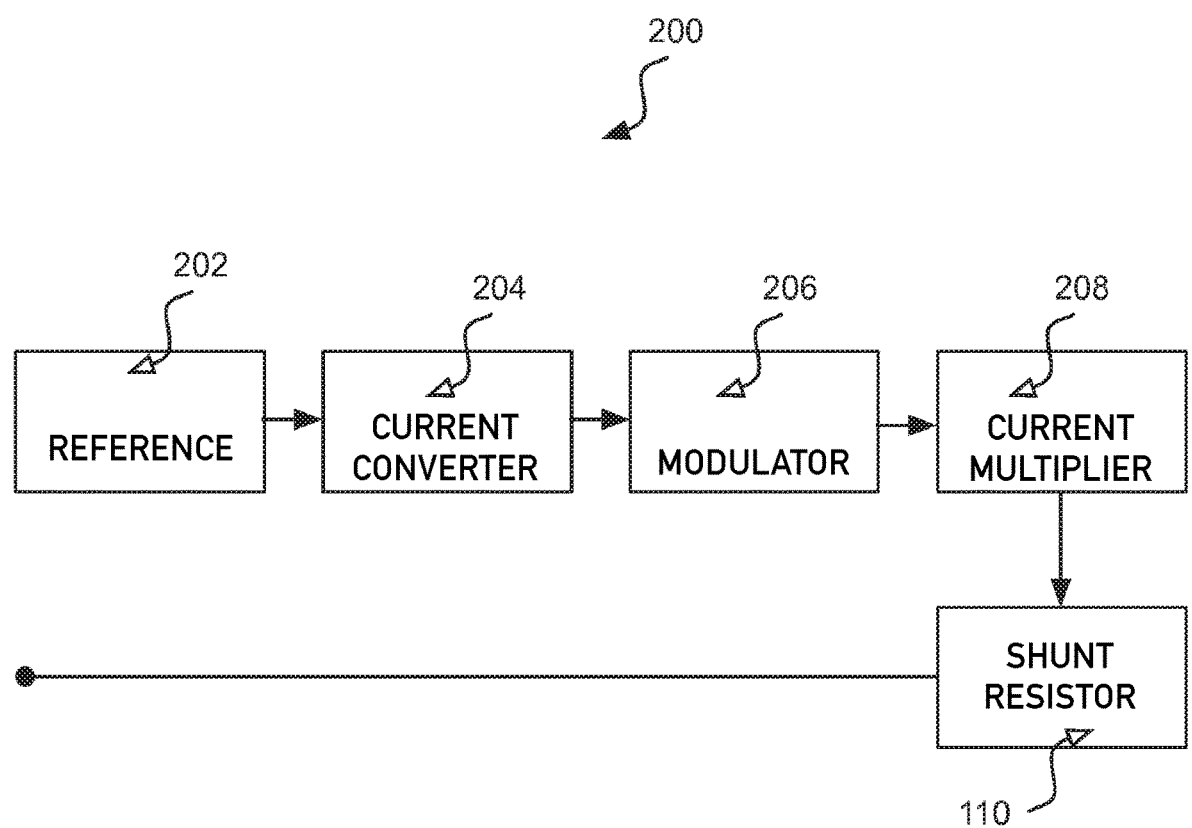
FIG. 2 is a block diagram representation of a signal source embodying the present invention.

As described above accurate determination of the load drawn current signal relies on the reference output signal generated by the signal source 112. A block diagram representation of a signal source 200 which embodies the present invention is shown in FIG. 2. The signal source comprises a bandgap reference 202, a voltage to current converter 204, a modulator 206 and a current multiplier 208. The bandgap reference 202 is operative to generate a reference voltage which is stable in temperature and over time. The stable reference voltage is received by the voltage to current converter 204 and converted to a stable reference current which is then modulated by the modulator 206 to generate a current signal having the desired characteristics, such as in terms of frequency, of the reference input signal that is to be applied to the shunt resistor 110. The modulated current is then received by the current multiplier 208 which is operative to multiply the modulated current up to a desired level for application to the shunt resistor as a reference input signal.

Figure 3A:
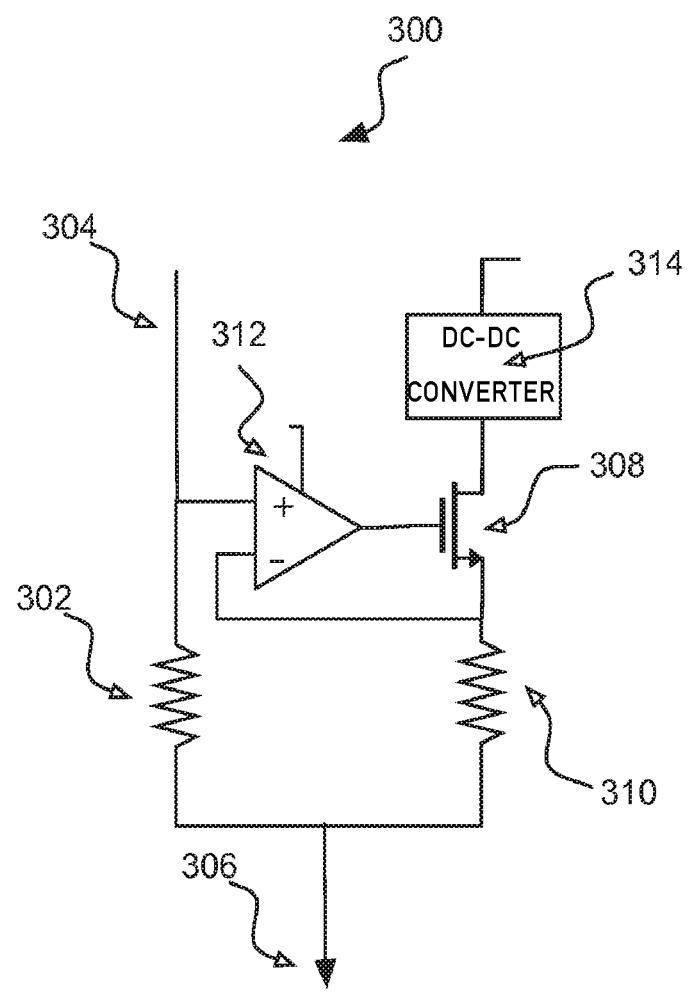
FIG. 3A is a circuit diagram of a first embodiment of the current multiplier comprised in the signal source of FIG. 2.

A circuit diagram of a first embodiment of the current multiplier is shown in FIG. 3A. The current multiplier 300 of FIG. 3A comprises a first resistor 302 in series between a multiplier input current node 304 and an output node 306. The circuit path between the multiplier input current node 304 and the output node 306 constitutes a first current path. The current multiplier 300 further comprises a n-FET 308 in series with a second resistor 310. The drain of the n-FET is connected to a positive supply and the source of the n-FET is connected to a first end of the second resistor 310. The second opposite end of the second resistor 310 is connected to the output node 306. The circuit path between the positive supply and the output node constitutes a second path. The current multiplier 300 yet further comprises an operational amplifier 312 which is connected at its non-inverting input to the multiplier input current node 304 and at its inverting input to the first end of the second resistor 310. The operational amplifier is at least one of auto-zeroed and chopped to thereby minimise offset and low frequency noise. The output of the operational amplifier 312 is connected to the gate of the n-FET 308. The current multiplier 300 also comprises a power efficient DC-DC converter 314 which is operative to reduce a high supply voltage to other circuitry of the current measurement apparatus to a lower voltage at the positive supply. The DC-DC converter is of a switching type to provide efficient generation of the lower voltage. The DC-DC converter uses capacitors or inductors to achieve the voltage reduction. The resistance of the second resistor, R2, is related to the resistance of the first resistor, R1, by R2=R1/(N−1).

The current multiplier comprises an array of resistor elements which are disposed in relation to each other to address integrated circuit processing spreads and temperature drifts. Each of the first and second resistors is comprised in the array of resistor elements to thereby provide for proper matching of the resistors. In addition the array of resistor elements comprises switches which are operable to change a resistance value for at least one of the first and second resistors whereby a current multiplication value of the current multiplier is changeable. The array of resistor elements also comprises redundant resistors which are switchable with operative resistors to reduce the effects of degradation with lifetime. Usage duty cycles of two such resistors employed as an operative resistor are different to thereby provide for tracking or detection of degradation. The current multiplier is also operative to swap resistor elements making up the first and second resistors on a periodic basis. This addresses resistance mismatching to first order by averaging such mismatch over time. The current multiplier is operative to swap the resistance elements of the first and second resistors at a frequency related to a frequency of the reference input signal to reduce the effect of ripple in current signals flowing in the current multiplier. The array of resistor elements is further configured to switch at least one of the first and second resistors to modulate the multiplier input current. Such modulation is employed as an alternative or addition to the modulation provided by the modulator of FIG. 2 to provide a reference input signal of desired time or frequency domain characteristics. An alternative or additional approach to modulation is achieved by switching at least one of the operational amplifier 312 and the n-FET 308.

Operation of the current multiplier 300 of FIG. 3A will now be described. The modulated current from the modulator 206 of FIG. 2 is received at the multiplier input current node 304 and flows through the first resistor 302 such that there is a voltage drop, V1, across the first resistor before flowing out of the current multiplier by way of the output node 306. The current flowing through the first resistor constitutes the multiplier input current. The operational amplifier 312 applies a control voltage to the gate of the n-FET 308 to switch the FET on such that a current flows through the FET from the positive supply and through the second resistor 310 before flowing out of the current multiplier by way of the output node 306. The current flowing through the n-FET and the second resistor constitutes the multiplier input current. As the n-FET switches on, the voltage drop, V2, across the second resistor 310 rises until V2 equals V1 whereupon the operational amplifier 312 is operative to maintain the control voltage applied to the gate. The current multiplier 300 is thus operative to maintain the voltages across the first and second resistors substantially equal whereby any change in the multiplier input current is mirrored by the multiplier output current with the amplitude of the multiplier output current being a multiple of the multiplier input current as determined by the ratio of the first and second resistors. Thus the multiplier output current is (N−1) times the multiplier input current. The multiplier input current and the multiplier output current both flow out of the current multiplier by way of the output node 306 such that their combined current is N times the multiplier input current. The combined current constitutes the reference input signal which is applied to the shunt resistor 110 of FIGS. 1 and 2.

Figure 3B:
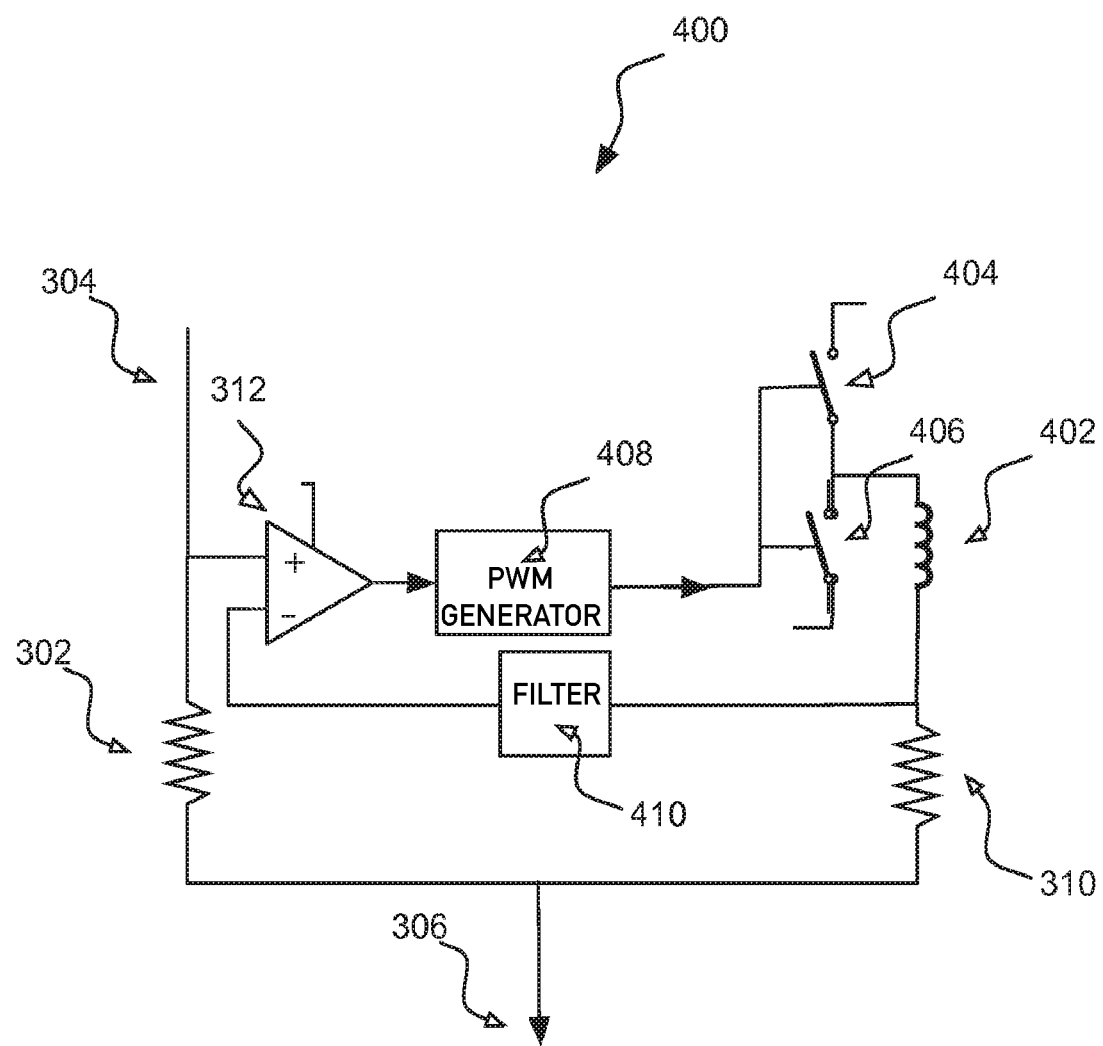
FIG. 3B is a circuit diagram of a second embodiment of the current multiplier comprised in the signal source of FIG. 2.

A circuit diagram of a second embodiment of the current multiplier 400 is shown in FIG. 3B. Components in common with the embodiment of FIG. 3A are designated by like reference numerals and the reader's attention is directed to the description provided above with reference to FIG. 3A for a description of such common components. Instead of the n-FET 308 of FIG. 3A the current multiplier 400 of FIG. 3B comprises an inductor 402 in series with the second resistor 310. An end of the inductor 310 opposite the end connected to the second resistor is connected to a first switch 404 to the positive power supply, which supplies the signal source, and to a second switch 406 to the negative power supply. It can thus be appreciated that the current multiplier 400 of FIG. 3B dispenses with the DC-DC converter 314 of FIG. 3A. The current multiplier 400 further comprises a Pulse Width Modulation (PWM) generator 408 which is driven by the output from the operational amplifier 312 and a filter 410 connected between the first end (i.e. the inductor connected end) of the second resistor 310 and the inverting input of the operational amplifier. In alternative forms the filter is constituted by configuring the operational amplifier as an integrator, by limiting the bandwidth of the operational amplifier or by connecting a capacitor across the second resistor 310. Other features of the current multiplier 400, such as in respect of the configuration and operation of the array of resistor elements, are as described above with reference to FIG. 3A.

Figure 4:
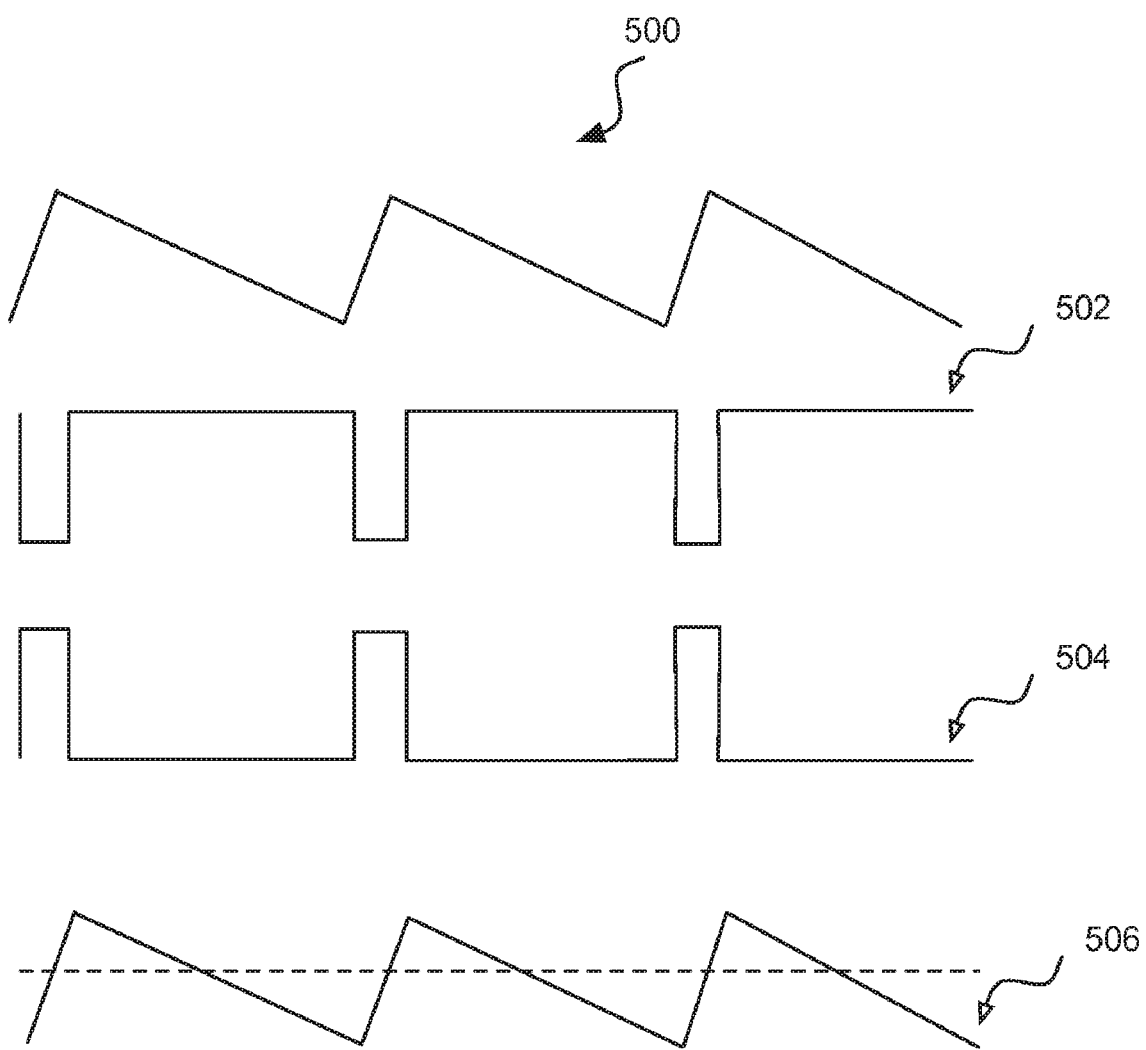
FIG. 4 shows waveforms in the second embodiment of the current multiplier.

The current multiplier 400 of FIG. 3B operates in a similar fashion to the current multiplier 300 of FIG. 3A. More specifically the feedback loop constituted by the switched inductor 402 and the operational amplifier 312 is operative to maintain the voltages across the first and second resistors 302, 310 substantially equal to thereby provide for current signal multiplication which is dependent on the ratio of the first and second resistors 302,310. The filter 410 is operative to average a ripple in the multiplier output current caused by the switching of the inductor 402. Waveforms 500 present in the current multiplier 400 of FIG. 3B are shown in FIG. 4. The top waveform 502 represents the control signal applied by the PWM generator 408 to the second switch 406 and the middle waveform 504 represents the control signal applied by the PWM generator 408 to the first switch 404. The bottom waveform 506 represents the ripple present in the output current from the current multiplier caused by switching of the inductor and which remains after averaging by the filter. The amplitude of the ripple depends on the inductor value and the switching frequency. The average output current as indicated by the dashed line through the bottom waveform is N−1 times the input current. The rise and fall of the ripple in the output current corresponds to the PWM generator 408 duty cycle employed to achieve the output current.

Figure 5A:
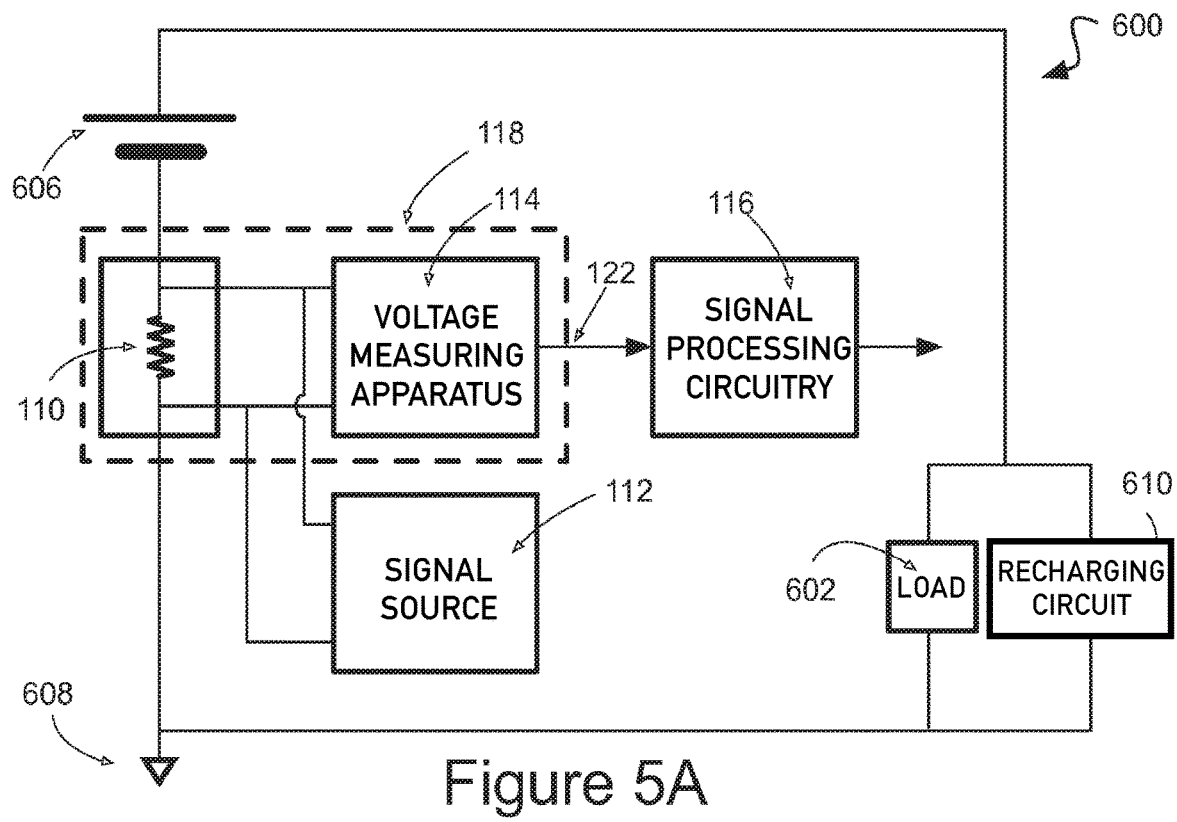
FIG. 5A is a block diagram representation of DC apparatus in which current measurement apparatus embodying the present invention is used for low side sensing.

The invention is applicable in DC apparatus. An example of such DC apparatus is propulsion apparatus comprising an electric battery. A block diagram representation of DC apparatus 600 in which current measurement apparatus embodying the present invention is used for low side sensing is shown in FIG. 5A. The DC apparatus 600 of FIG. 5A is comprised in an electric vehicle or other battery powered device. The DC apparatus 600 comprises a battery 606. The delivered and charging current of the battery 606 is measured through a low-side sensor in the form of a shunt resistor 110. The DC apparatus 600 further comprises a signal source 112, voltage measuring apparatus 114 and processing apparatus 116 of a form and function as described above with reference to FIG. 1. The common node 608 between the battery 606 and a load 602 and a recharging circuit 610 is represented in FIG. 5A as an effective ground point.

When a load current is delivered by the battery 606 to the load 602, the shunt resistor 110 passes the same load current. When the recharging circuit 610, e.g. a dynamo, recharges the battery 606 the current flowing into the shunt resistor 110 is the battery charging current. The shunt resistor 110 is therefore operative to measure current during discharging and charging of the battery. In the DC apparatus of FIG. 5A the load current changes significantly by orders of magnitude from mAmps to 1000's Amps. Also the load current can have different frequency components depending on the nature of the load and on switching of the load. WO 2013/038176 describes ways in which the apparatus can be made resilient to differing signal content in the load current.

Figure 5B:
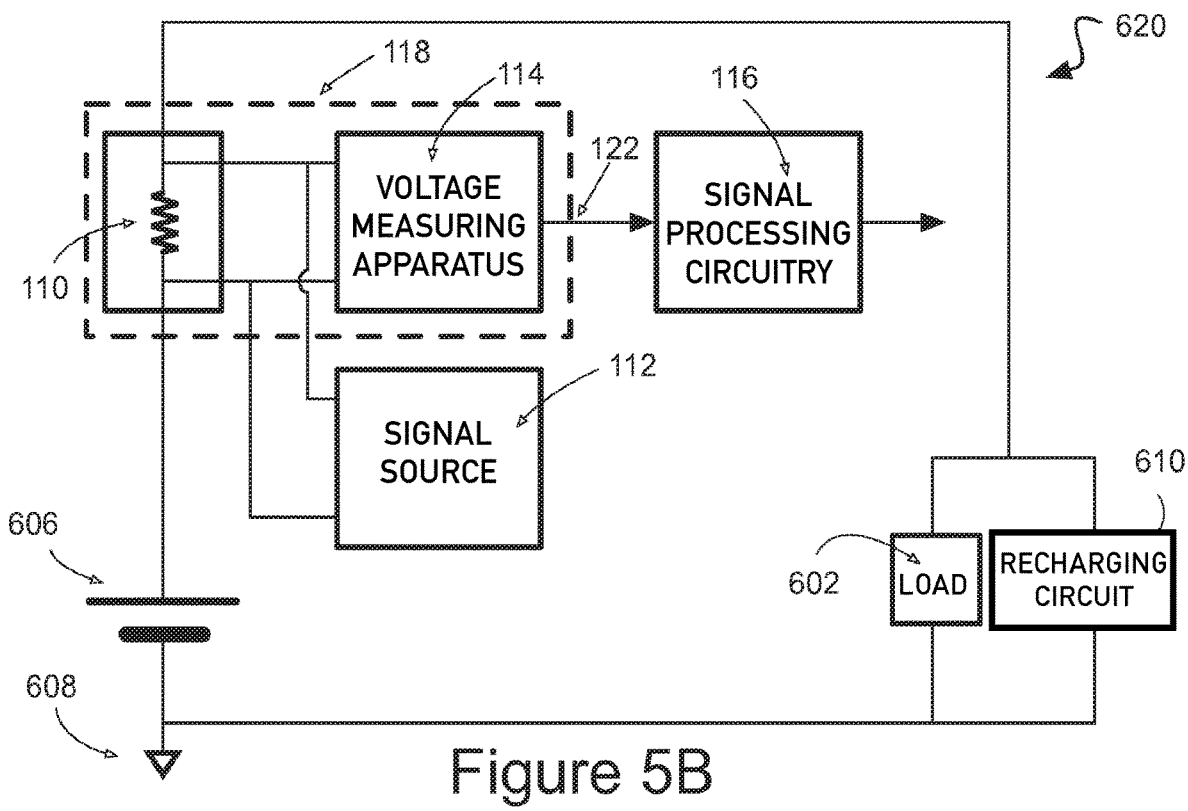
FIG. 5B is a block diagram representation of DC apparatus in which current measurement apparatus embodying the present invention is used for high side sensing.

An alternative configuration of the DC apparatus of FIG. 5A is shown in FIG. 5B. The DC apparatus 620 of FIG. 5B provides for high side sensing instead of the low side sensing of the DC apparatus 600 of FIG. 5A. Components common to the DC apparatus of FIGS. 5A and 5B are designated by like reference numerals. The reader's attention is therefore directed to the description of such common components which is provided above with reference to the DC apparatus 600 of FIG. 5A. The form and function of the DC apparatus 620 of FIG. 5B is the same as the DC apparatus 600 of FIG. 5A except as follows. In FIG. 5B the shunt resistor 110 is disposed in the positive path to the load 602 and the recharging circuit 610. It is advantageous under certain circumstances for the signal source 112 to pull a current through the shunt resistor 110 as is done in the DC apparatus 620 of FIG. 5B.

Figure 6:
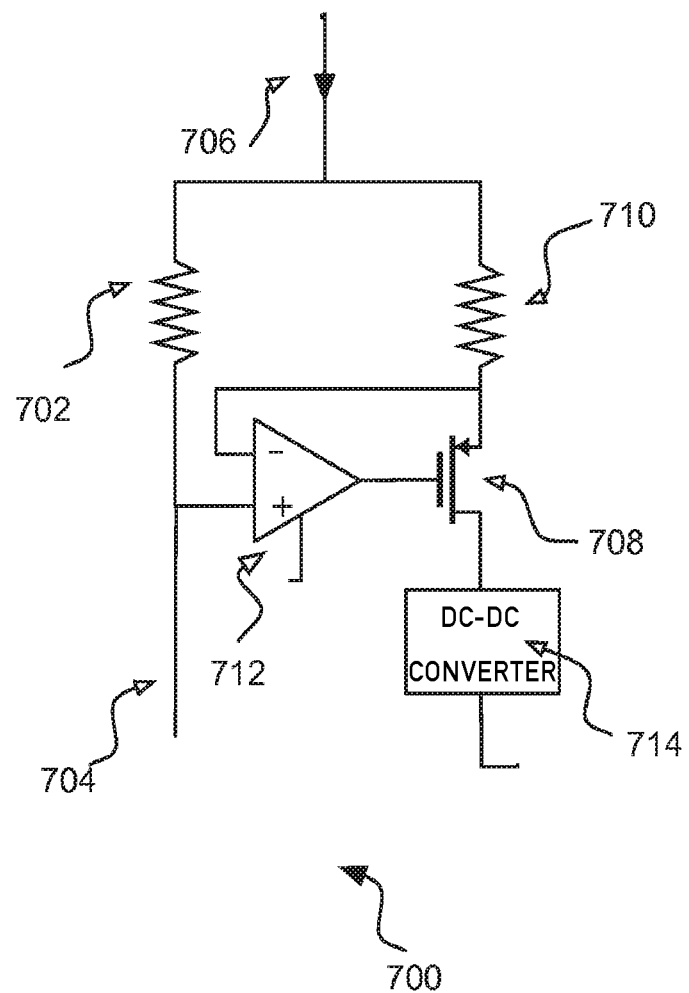
FIG. 6 is a circuit diagram of a third embodiment of the current multiplier comprised in the signal source of FIG. 2.

A circuit diagram of a third embodiment of current multiplier 700 comprised in the signal source of FIG. 2 is shown in FIG. 6. The current multiplier 700 has the same function as the current multiplier 300 of FIG. 3A with the current multiplier 700 of FIG. 6 being configured to sink a multiplied current whereas the current multiplier 300 of FIG. 3A is configured to source a multiplied current. The current and voltages in the current multiplier 700 of FIG. 6 are therefore inverted such that the output of the current multiplier is pulled through a common node output 706 by a p-FET type current source 708. The p-FET type current source 708 is controlled by an amplifier 712 which compares a voltage developed on a first resistor 702 by the current multiplier input current 704 with a multiplied current developed on a second resistor 710. The current developed on the second resistor 710 is supplied by a current source 708 from a DC-DC converter 714. The DC-DC converter 714 generates a negative supply relative to the common node output 706 of lower magnitude than a negative power supply that provides current to the first resistor 702. Features described above with reference to the current multiplier 300 of FIG. 3A are equally applicable to the current multiplier 700 of FIG. 6. The second embodiment of current multiplier 400 of FIG. 3B can be inverted in a similar fashion to the current multiplier 700 of FIG. 6.

The invention claimed is:

1. A current measurement apparatus comprising:
a first resistance, including a first terminal to receive an input current signal, and including a second terminal to provide an output node;
a second resistance, including a first terminal to receive an augmented current signal based on the input current signal, and including a second terminal coupled to the output node to sum the augmented current signal with the input current signal to provide a reference input current to the output node via the second terminal of the first and second resistances; and
an amplifier circuit including first and second inputs respectively coupled to the first terminal of the first resistance and the first terminal of the second resistance to maintain like respective voltages thereof by using a feedback configuration to generate the augmented current signal.

2. The apparatus of claim 1, further comprising:
a measurement arrangement configured to be disposed in relation to a load to measure a load drawn current signal that passes through the load and to receive the reference input current, wherein an output signal from the measurement arrangement comprises a load output signal, corresponding to the load drawn current signal, and a reference output signal, corresponding to the reference input current.

3. The apparatus of claim 1, further comprising:
a processing circuit configured to receive the reference input current and make a determination in dependence on the reference output signal.

4. The apparatus of claim 1, wherein power drawn through the second resistance is less than power drawn through the first resistance.

5. The apparatus of claim 1, wherein a current level through the second resistance is more than one order of magnitude greater than a current level through the first resistance.

6. The apparatus of claim 1, wherein the current though the second resistance is a multiple of the current through the first resistance and power drawn through the second resistance as divided by the multiple is less than power drawn through the first resistance.

7. The apparatus of claim 1, further comprising:
a measurement circuit to generate an acquired voltage signal based upon a voltage across a shunt resistor produced by a load drawn current in the shunt resistor and the reference input current in the shunt resistor; and
a processing circuit configured to receive the acquired voltage signal and to make a determination in dependence on the acquired voltage signal.

8. The apparatus of claim 1, wherein the amplifier circuit includes a non-inverting input terminal coupled to the first terminal of the first resistance, and an inverting input terminal coupled to the first terminal of the second resistance, and an amplifier output coupled to a switch that modulates flow of the augmented current signal in the second resistance.

9. The apparatus of claim 1, wherein a ratio of a first resistance value and a second resistance value sets the augmented current signal to a desired multiple value of the input current signal.

10. The apparatus of claim 9, wherein at least one of the resistances which provides for the ratio of resistances comprises plural resistor elements.

11. The apparatus of claim 10, further comprising at least one switch which is operative to switch between different ones of the plural resistor elements, wherein a duty cycle for switching the at least one switch is determined based on at least one of resistor element degradation and resistor element matching.

12. The apparatus of claim 1, wherein the amplifier circuit includes an amplifier output, and wherein the apparatus further includes a controllable current source configured to provide the augmented current signal based on an amplifier output signal at the amplifier output.

13. The apparatus of claim 12, wherein the current source comprises a transistor, and wherein one of a gate and base of the transistor comprises a control input of the current source.

14. The apparatus of claim 1, further comprising a first power supply configured to provide power to a first current source that supplies the input current signal to the first resistance, and a second power supply configured to provide power to a second current source that supplies the augmented current signal to the second resistance, wherein a magnitude of a voltage of the second power supply is less than a magnitude of a voltage of the first power supply.

15. The apparatus of claim 14, wherein the second power supply comprises a DC-DC converter configured to reduce a magnitude of a power supply voltage to the second current source.

16. The apparatus of claim 14, wherein the second current source comprises an inductor coupled in series between the second power supply and the second resistance, wherein the inductor is switched between a high side of the second power supply and a low side of the second power supply.

17. The apparatus of claim 16, further comprising a pulse width modulator, wherein the amplifier includes an amplifier output that controls the pulse width modulator, and wherein switching of the inductor is controlled by an output from the pulse width modulator that is based on the amplifier output.

18. A current measurement apparatus comprising:
a first resistance, including a second terminal coupled to an output node and including a first terminal to receive an input current signal portion of a reference input current received at the output node;
a second resistance, including a second terminal coupled to the output node and including a first terminal coupled to receive an augmented current signal portion of the reference input current received at the output node; and
an amplifier circuit including first and second inputs respectively coupled to the first terminal of the first resistance and the first terminal of the second resistance to maintain like respective voltages thereof by using a feedback configuration to generate the augmented current signal.

19. The current measurement apparatus of claim 18, further comprising:
a negative first power supply configured to sink the reference input current from the output node through the first resistance; and
a negative second power supply configured to sink the augmented current signal from the output node through the second resistance.

20. The current measurement apparatus of claim 18, wherein power drawn through the second resistance is less than power drawn through the first resistance.

21. The current measurement apparatus of claim 18, further comprising:
a measurement arrangement configured to be disposed in relation to a load to measure a load drawn current signal that passes through the load and to receive the reference input current at the output node, wherein an output signal from the measurement arrangement comprises a load output signal, corresponding to the load drawn current signal, and a reference output signal, corresponding to the reference input current.

22. The current measurement apparatus of claim 18, wherein a current level through the second resistance is more than one order of magnitude greater than a current level through the first resistance.

23. A method for providing a reference current signal, comprising:
providing an input current signal at a first terminal of a first resistance;
receiving the input current signal at a second terminal of the first resistance;
providing an augmented current signal based on the input current signal to a first terminal of a second resistance;
receiving the augmented current signal at a second terminal of the second resistance; and
summing the augmented current signal with the input current signal to provide the reference current signal.

24. The method of claim 23, wherein the generating the reference input current further includes:
comparing voltages at the first terminal of the first resistance and the first terminal of the second resistance; and
generating the augmented current signal based on the comparison to maintain like respective voltages at the first terminal of the first resistance and the first terminal of the second resistance.

25. The method of claim 24, wherein the comparing the voltages includes receiving the voltages at respective inputs of an amplifier circuit and providing a control signal from the amplifier circuit to a switch to modulate the augmented current signal in the second resistance.

26. The method of claim 23, wherein the providing the input current signal at terminal of the first resistance includes using a first power supply;
wherein the providing the augmented current signal to the first terminal of the second resistance includes using a second power supply;
wherein a magnitude of a voltage of the second power supply is less than a magnitude of a voltage of the first power supply.

27. The method of claim 26, wherein the providing the augmented current signal includes using a DC-DC converter to reduce a magnitude of a power supply voltage to the second power supply.

28. The method of claim 23, wherein the providing the augmented current signal to the first terminal of the second resistance includes providing the augmented current signal from an inductor to the second resistance, and switching the inductor between high and low sides of a power supply to adjust a magnitude of the augmented current signal.

29. A method for measuring a current signal provided to an electrical load using a measurement arrangement between a supply and the load, the method comprising:
generating a reference input current to provide to the measurement arrangement;
providing a load-drawn current and the reference input current to the measurement arrangement; and
determining information about the load-drawn current based on a transfer function for the reference input current in the measurement arrangement;
wherein the generating the reference input current includes:
providing an input current signal at a first terminal of a first resistance;
receiving the input current signal at a second terminal of the first resistance;
providing an augmented current signal based on the input current signal to a first terminal of a second resistance;
receiving the augmented current signal at a second terminal of the second resistance; and
summing the augmented current signal with the input current signal to provide the reference input current.

30. The method of claim 29, wherein the generating the reference input current further includes:
comparing voltages at the first terminal of the first resistance and the first terminal of the second resistance; and generating the augmented current signal based on the comparison to maintain like respective voltages at the first terminal of the first resistance and the first terminal of the second resistance.

31. The method of claim 30, wherein the comparing the voltages includes receiving the voltages at respective inputs of an amplifier circuit and providing a control signal from the amplifier circuit to a switch to modulate the augmented current signal in the second resistance.

32. The method of claim 29, wherein the generating the reference input current includes using an amplifier circuit to sense information about voltages at the first terminals of the first and second resistances and, in response, control a current source to provide the augmented current signal.

33. The method of claim 29, wherein the providing the input current signal includes using a first power supply, wherein the providing the augmented current signal includes using a second power supply, and wherein a power dissipation characteristic of the second power supply is less than a power dissipation characteristic of the first power supply.

* * * * *